(12) United States Patent
Lin et al.

(10) Patent No.: US 11,587,854 B2
(45) Date of Patent: Feb. 21, 2023

(54) SYSTEM IN PACKAGE

(71) Applicant: WALTON ADVANCED ENGINEERING INC., Kaohsiung (TW)

(72) Inventors: Chun Jung Lin, Kaohsiung (TW); Ruei Ting Gu, Kaohsiung (TW)

(73) Assignee: WALTON ADVANCED ENGINEERING INC., Kaohsiung (TW)

( * ) Notice: Subject to any disclaimer, the term of this patent is extended or adjusted under 35 U.S.C. 154(b) by 0 days.

(21) Appl. No.: 17/353,857

(22) Filed: Jun. 22, 2021

(65) Prior Publication Data

US 2022/0293495 A1    Sep. 15, 2022

(30) Foreign Application Priority Data

Mar. 12, 2021    (TW) .................................. 110108825

(51) Int. Cl.
*H01L 23/49* (2006.01)
*H01L 25/065* (2023.01)
*H01L 23/00* (2006.01)
*H01L 23/31* (2006.01)

(52) U.S. Cl.
CPC .......... *H01L 23/49* (2013.01); *H01L 23/3107* (2013.01); *H01L 24/48* (2013.01); *H01L 24/73* (2013.01); *H01L 25/0657* (2013.01); *H01L 2224/48145* (2013.01); *H01L 2224/48195* (2013.01); *H01L 2224/48245* (2013.01); *H01L 2225/06506* (2013.01); *H01L 2225/06582* (2013.01)

(58) Field of Classification Search
CPC ... H01L 23/49; H01L 23/495; H01L 25/0657; H01L 2224/48495
See application file for complete search history.

(56) References Cited

U.S. PATENT DOCUMENTS

| | | | |
|---|---|---|---|
| 5,089,877 A * | 2/1992 | Queyssac ................ | H01L 23/58 361/730 |
| 5,161,304 A * | 11/1992 | Queyssac ................ | H01L 23/58 174/541 |

* cited by examiner

*Primary Examiner* — Yu-Hsi D Sun
(74) *Attorney, Agent, or Firm* — Bacon & Thomas, PLLC

(57) ABSTRACT

The present application describes a system in package which features no printed circuit board inside an encapsulation structure and comprises: a copper holder with a silicon layer at a top face; a plurality of dies mounted on the silicon layer and electrically connected to a plurality of data pins of the copper holder; a passive element mounted on the silicon layer and electrically connected to the dies wherein the dies are electrically connected to the ground pin of the copper holder; a molding compound encasing the dies and the passive element on the top face of the copper holder.

8 Claims, 5 Drawing Sheets

SYSTEM IN PACKAGE

BACKGROUND OF THE INVENTION

Field of the Invention

The present application relates to a system in package, particularly an encapsulation structure in which no printed circuit board exists for electric conduction based on metal wires.

Description of the Prior Art

The existing technology for encapsulation of integrated circuits allows total or most electronic functional configurations in a system or a subsystem to be incorporated in an integral substrate to which dies are connected through the 2D/3D packaging technology and is referred to as the system in package (SiP) for manufacturing processes.

The system in package (SiP) is used to integrate multiple chips and characteristic of one substrate on which a proprietary processor along with DRAMs, flash memories and passive elements are integrated with resistors, capacitors, a connector and an antenna. That is, a complete functional unit can be constructed in a multichip package which is supported by a handful of external components for its functions.

The system in package (SiP) is advantageous in reduction of the system cost compared with the system on a chip (SoC), for example, significantly smaller volume, lighter weight and lower power consumption. However, a SiP-based encapsulated body probably encase dozens of bare chips, all of which could be incapacitated in case of one bare chip malfunctioned, and is produced by a manufacturer through a specifically designed production line for SiP as required or the ratio of manufacturing machines adjusted for optimized utilization efficiency.

There have been several literatures for the system in package (SiP), as disclosed in following patents:

U.S. Ser. No. 15/939,097 discloses system-in-package structures and methods of assembly. In one embodiment, a system-in-package includes opposing circuit boards, each including mounted components overlapping the mounted components of the opposing circuit board. A gap between the opposing circuit boards may be filled with a molding material that additionally encapsulates the overlapping mounted components. In some embodiments, the opposing circuit boards are stacked on one another using one or more interposers that may provide mechanical or electrical connection.

U.S. 61/929,130 discloses a system-in-package module which comprises a non-memory chip, a wrap-around memory and an airtight encapsulation material. The non-memory chip is paired with a plurality of pads; the wrap-around memory comprises a first memory die and a second memory die wherein both the first memory die and the second memory die form at a substrate abreast, the first memory die comprises a first group of pads and the second memory die comprises a second group of pads. The airtight encapsulation material encases the non-memory chip and the wrap-around memory wherein the non-memory chip is electrically coupled to the wrap-around memory through the plurality of pads, the first group of pads and the second group of pads. The first group of pads turned a default angle or being under mirror mapping correspond to the second group of pads.

TW 201737452 discloses a system in package (SiP), which includes: a RDL structure; a first semiconductor die mounted on the first side of the RDL structure and having an active surface directly contacting with the RDL structure; a plurality of conductive fingers on the first side of the RDL structure around the first semiconductor die; a second semiconductor die stacked on the first semiconductor die directly and electrically connected to the plurality of conductive fingers through a plurality of bond wires; a mold cap encapsulating the first semiconductor die, the conductive fingers, the second semiconductor die and the first side of the RDL structure. In addition, TW 201737452 also discloses a method to fabricate a system in package for routing flexibility.

However, a manufacturer for chip encapsulation in severe market competitions withstands intense pressures like further reduction of manufacturing cost and scaling-down of volume/weight. Thus, how to effectuate and maintain reliability of encapsulated dies is a tough issue for a manufacturer.

SUMMARY OF THE INVENTION

In virtue of the above issues, a system in package provided in the present disclosure is characteristic of an encapsulation structure in which no printed circuit board exists for the overall cost reduced remarkably.

Accordingly, a system in package provided in the present disclosure is characteristic of removal of a printed circuit board for thinning an encapsulation structure.

A system in package provided in the present disclosure accommodates multiple layers inside a thinned encapsulation structure for additions of miscellaneous functions.

A system in package provided in the present disclosure is characteristic of direct electric conduction through metal wires for promotion of electrical performance and reduction in output of waste heat.

A system in package provided in the present disclosure is characteristic of an aluminum layer structure for promotion of a grounding effect and good performance of thermal conductance.

To this end, the major technical measures in the present application are embodied according to the following technical solution. In the present disclosure, a system in package with no printed circuit board inside an encapsulation structure comprises: a copper holder with a plurality of data pins and at least a ground pin; a silicon layer on a top face of the copper holder; a plurality of dies mounted on the silicon layer and electrically connected to the data pins of the copper holder; at least a passive element mounted on the silicon layer and electrically connected to the dies wherein the dies are electrically connected to the ground pin of the copper holder; a molding compound encasing the dies and the passive element on the top face of the copper holder.

The purposes and technical issues in the present disclosure are further embodied by referring to the following technical measures.

In the above system in package, the dies are electrically connected to the data pins of the copper holder through a plurality of first metal wires.

In the above system in package, the passive element is electrically connected to the dies through a plurality of second metal wires.

In the above system in package, the dies are electrically connected to the ground pin of the copper holder through a plurality of third metal wires.

In the above system in package, the passive element is electrically connected to the ground pin of the copper holder through at least a fourth metal wire.

In the above system in package, the passive element is electrically connected to the data pins of the copper holder through at least a fifth metal wire.

In the above system in package, the silicon layer and the die accommodate an aluminum layer in between.

In the above system in package, the aluminum layer is electrically connected to the ground pin of the copper holder through at least a sixth metal wire.

In contrast to the prior art, a system in package in the present disclosure proves effective in: (1) replacing a printed circuit board by metal wires for an overall cost reduced remarkably; (2) eliminating a printed circuit board for reduction of a package thickness; (3) providing an aluminum layer structure for promotion of a grounding effect and good performance of thermal conductance.

BRIEF DESCRIPTIONS OF THE DRAWINGS

DETAILED DESCRIPTIONS OF THE PREFERRED EMBODIMENTS

A system in package is explained in the preferred embodiments for clear understanding of purposes, characteristics and effects of the present application.

Figure 1A:
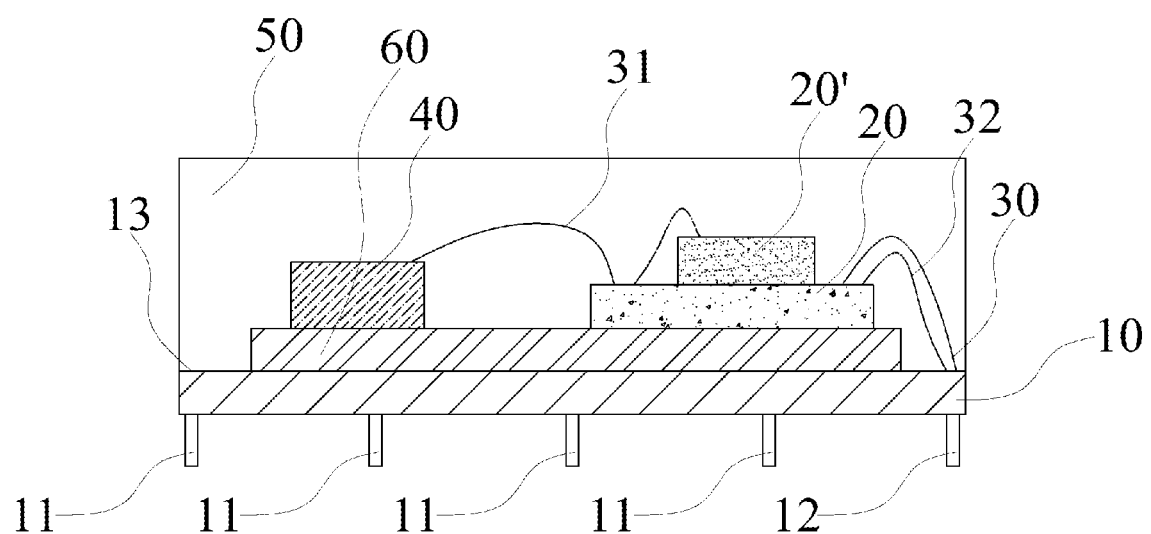
FIG. 1a is a schematic view of a system in package in the first embodiment.
Figure 3A:
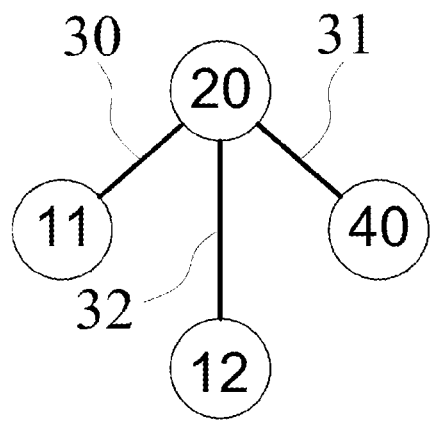
FIG. 3a is a schematic view for electric connection of a system in package in the first embodiment.

FIGS. 1a and 3a illustrate a system in package in the first embodiment. Referring to FIG. 1a, which illustrates: a copper holder (10) with a plurality of data pins (11) and at least a ground pin (12); the copper holder (10) having a silicon layer (60) at a top face (13); the silicon layer (60) on which a plurality of dies (20, 20') are electrically connected to the data pins (11) of the copper holder (10); the silicon layer (60) on which at least a passive element (40) is electrically connected to the dies (20); the dies (20, 20') electrically connected to the ground pin (12) of the copper holder (10); a molding compound (50) which is used to encase the dies (20, 20') and the passive elements (40) on the top face (13) of the copper holder (10); the dies (20, 20') electrically connected to the ground pin (12) of the copper holder (10) through a plurality of third metal wires (32).

In a system in package, a plurality of die (20, 20') on the silicon layer (60) are electrically connected to the data pins (11) of the copper holder (10) through a plurality of first metal wires; moreover, the passive element (40) is electrically connected to the dies (20, 20') through a plurality of second metal wires (31).

Specifically, the copper holder (10) is a lead frame, which is manufactured as a metal structure for encapsulation of a die inside and used to transmit signals from a die to the outside, and is made up of different sections such that all components are fixed inside a frame structure by structural connections for automated processing in a lead-wire frame easily; moreover, the data pins (11) are effective in electrical connections between the dies (20, 20') and the outside; the ground pin (12) is an earth lead as a zero potential reference in a circuit design generally and also a reference potential of a whole circuit, that is, 0V at the earth lead for the uniform electrical potential in a whole circuit.

The dies (20, 20') are miniature semiconductor-based integrated circuit bodies which are cut from a wafer and not encapsulated; in a system in package, a first metal wire (30), a second metal wire (31) and a third metal wire (32) are metal wires for wire bonding that is a technology to link a die and a lead frame by metal wires featuring wire diameters from 15 to 50 μm for communication between a miniature die and an outside circuit without extra areas; the passive element (40) is a passive component or a passive device which is an electronic device consuming but not generating energy or producing no gain; the molding compound (50) is a semiconductor encapsulating material based on common polymer resins for electronic components and chips; the silicon layer (60) is an insulated structural layer made of silicon (Si), which displays gray-blue, metallic, rigid and fragile crystals and is a tetravalent metalloid semiconductor; the top face (13) is one side of the silicon layer (60) for carrying the dies (20, 20') and the passive element (40).

Referring to FIG. 3a, which illustrates the die (20) is electrically connected to the data pins (11), the ground pin (12) and the passive element (40), respectively, wherein: the die (20) is electrically connected to the data pins (11) through the first metal wire (30) such that electric conduction between outside signals/power and the die (20) is created and signals are transmitted to the outside; the die (20) is electrically connected to the ground pin (12), which is taken as a zero potential reference and also a reference potential of a whole circuit, that is, 0V at the ground pin (12) for the uniform electrical potential in a whole circuit, through the third metal wire (32); the die (20) is electrically connected to the passive element (40), which can be a quartz crystal unit (or Xtal), a resistor, a capacitor or an inductor to support operation of the die (20), through the second metal wire (31); the die (20) is further paired with a memory component in practice.

Figure 1B:
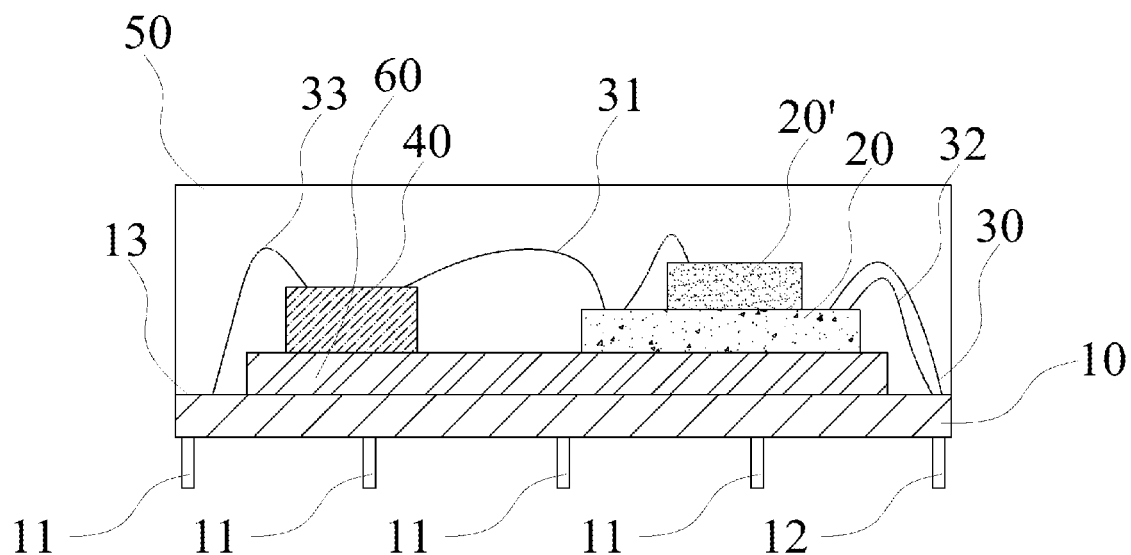
FIG. 1b is a schematic view of a system in package in the second embodiment.
Figure 3B:
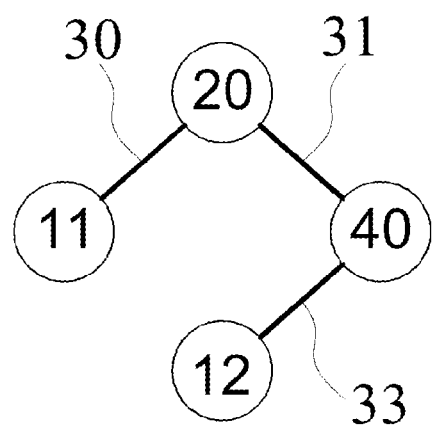
FIG. 3b is a schematic view for electric connection of a system in package in the second embodiment.

Referring to FIGS. 1B and 3b, which illustrate a system in package in the second embodiment. In the second embodiment different from the first embodiment, a fourth metal wire (33) is added. Referring to FIG. 1b first, which illustrates the passive element (40) is electrically connected to the ground pin (12) of the copper holder (10) through the fourth metal wire (33).

Specifically, the passive element (40) which can be a grounded resistor or a grounded capacitor is further electrically connected to the ground pin (12); the fourth metal wire (33) is a metal wire for wire bonding that is a technology to link a chip and a lead frame by metal wires featuring wire diameters from 15 to 50 μm for communication between a miniature die and an outside circuit without extra areas.

In practice, the die (20) is electrically connected to the ground pin (12) of the copper holder (10) through the fourth metal wire (33) by way of the passive element (40) partly and indirectly; moreover, the die (20) is electrically connected to the ground pin (12) partly through the third metal wire (32), as disclosed in the first embodiment for the die (20).

Referring to FIG. 1b, which illustrates: a copper holder (10) with a plurality of data pins (11) and at least a ground pin (12); the copper holder (10) having a silicon layer (60) at a top face (13); the silicon layer (60) on which a plurality of dies (20, 20') are electrically connected to the data pins (11) of the copper holder (10) through a plurality of first metal wires (30); the silicon layer (60) on which at least a passive element (40) is electrically connected to the dies (20, 20') through a plurality of second metal wires (31); the dies (20, 20') electrically connected to the ground pin (12) of the copper holder (10); a molding compound (50) which is used to encase the dies (20, 20') and the passive element (40) on the top face (13) of the copper holder (10); the dies (20, 20') electrically connected to the ground pin (12) of the copper holder (10) through a plurality of third metal wires (32); the passive element (40) electrically connected to the ground pin (12) of the copper holder (10) through a fourth metal wire (33).

Referring to FIG. 3b, which illustrates the die (20) is electrically connected to the data pins (11), the ground pin (12) and the passive element (40), respectively, wherein: the die (20) is electrically connected to the data pins (11) through the first metal wire (30) such that electric conduction between outside signals/power and the die (20) is created and signals are transmitted to the outside; the die (20) is electrically connected to the passive element (40), which can be a quartz crystal unit (or Xtal), a resistor, a capacitor or an inductor to support operation of the die (20), through the second metal wire (31); the passive element (40) is electrically connected to the ground pin (12), which is taken as a zero potential reference and also a reference potential of a whole circuit, that is, 0V at the ground pin (12) for the uniform electrical potential in a whole circuit, through the fourth metal wire (33); the die (20) is further paired with a memory component in practice.

Figure 1C:
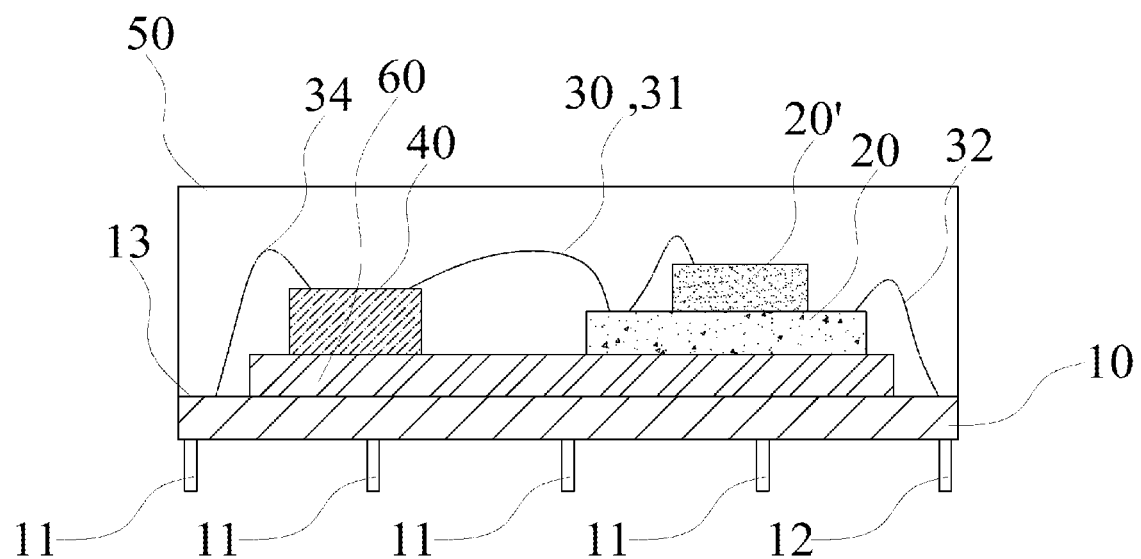
FIG. 1c is a schematic view of a system in package in the third embodiment.
Figure 3C:
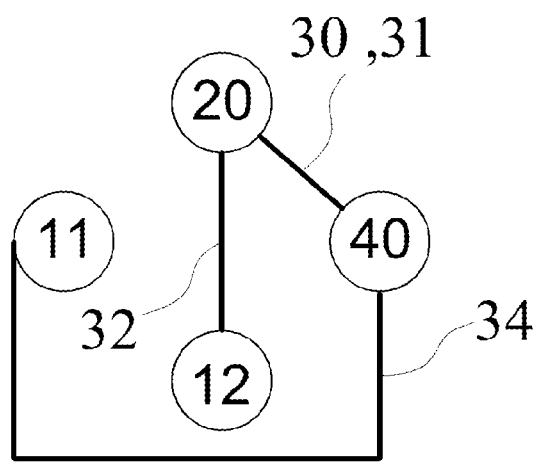
FIG. 3c is a schematic view for electric connection of a system in package in the third embodiment.

Referring to FIGS. 1c and 3c, which illustrate a system in package in the third embodiment. In the third embodiment different from the first embodiment, a fifth metal wire (34) is added. Referring to FIG. 1c, which illustrates the passive element (40) is electrically connected to the data pins (11) of the copper holder (10) through the fifth metal wire (34).

Specifically, the passive element (40) can be a filter, a resistor or a capacitor with which signals from the die (20) are processed and transmitted to the data pins (11) through the electrically connected fifth metal wire (34); the fifth metal wire (34) is a metal wire for wire bonding that is a technology to link a chip and a lead frame by metal wires featuring wire diameters from 15 to 50 μm for communication between a miniature die and an outside circuit without extra areas.

Referring to FIG. 3c, which illustrates the die (20) is electrically connected to the data pins (11), the ground pin (12) and the passive element (40), respectively, wherein: the die (20) is electrically connected to the passive element (40), which can be a quartz crystal unit (or Xtal), a resistor, a capacitor or an inductor to support operation of the die (20), through the second metal wire (31) (or the first metal wire (30)); the die (20) is electrically connected to the ground pin (12), which is taken as a zero potential reference and also a reference potential of a whole circuit, that is, 0V at the ground pin (12) for the uniform electrical potential in a whole circuit, through the third metal wire (32); the passive element (40) is electrically connected to the data pins (11) through the fifth metal wire (34) such that electric conduction between outside signals/power and the die (20) is created indirectly and signals are transmitted to the outside; the die (20) is further paired with a memory component in practice.

Figure 2A:
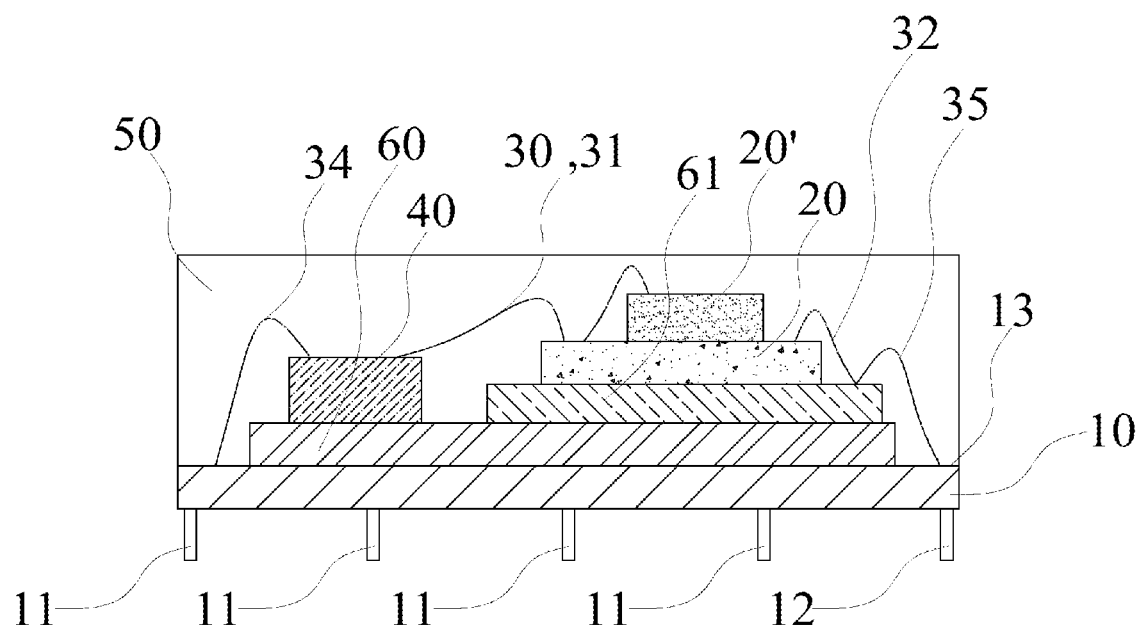
FIG. 2a is a schematic view of a system in package in the fourth embodiment.
Figure 4A:
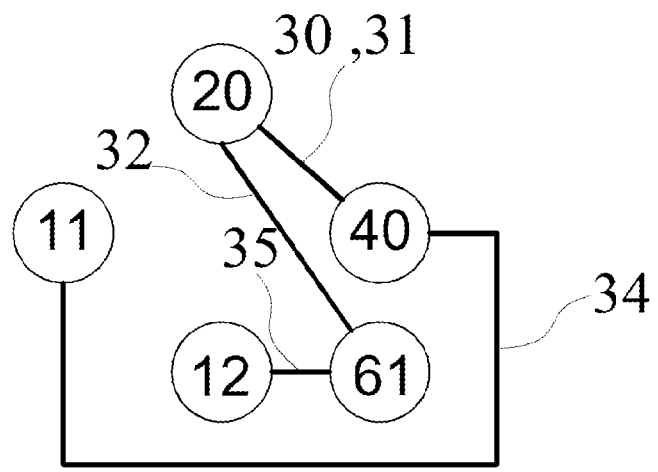
FIG. 4a is a schematic view for electric connection of a system in package in the fourth embodiment.

Referring to FIGS. 2a and 4a, which illustrate a system in package in the fourth embodiment. In the fourth embodiment different from the third embodiment, an aluminum layer (61) is added. Referring to FIG. 2a, which illustrates an aluminum layer (61) is coated between the silicon layer (60) and the die (20) and electrically connected to the ground pin (12) of the copper holder (10) through a sixth metal wire (35).

Specifically, the aluminum layer (61) is a metal conducting layer as an effective interface with which a concentrated grounding connection is created; the sixth metal wire (35) is a metal wire for wire bonding that is a technology to link a chip and a lead frame by metal wires featuring wire diameters from 15 to 50 μm for communication between a miniature die and an outside circuit without extra areas.

Referring to FIG. 4a, which illustrates the die (20) is electrically connected to the data pins (11), the ground pin (12), the passive element (40) and the aluminum layer (61), respectively, wherein: the die (20) is electrically connected to the passive element (40), which can be a quartz crystal unit (or Xtal), a resistor, a capacitor or an inductor to support operation of the die (20), through the second metal wire (31) (or the first metal wire (30)); the die (20) is electrically connected to the aluminum layer (61) for a concentrated grounding connection through the third metal wire (32); the aluminum layer (61) is electrically connected to the ground pin (12), which is taken as a zero potential reference and also a reference potential of a whole circuit, that is, 0V at the ground pin (12) for the uniform electrical potential in a whole circuit, through the sixth metal wire (35); the passive element (40) is electrically connected to the data pins (11) through the fifth metal wire (34) such that electric conduction between outside signals/power and the die (20) is created indirectly and signals are transmitted to the outside; the die (20) is further paired with a memory component in practice.

Figure 2B:
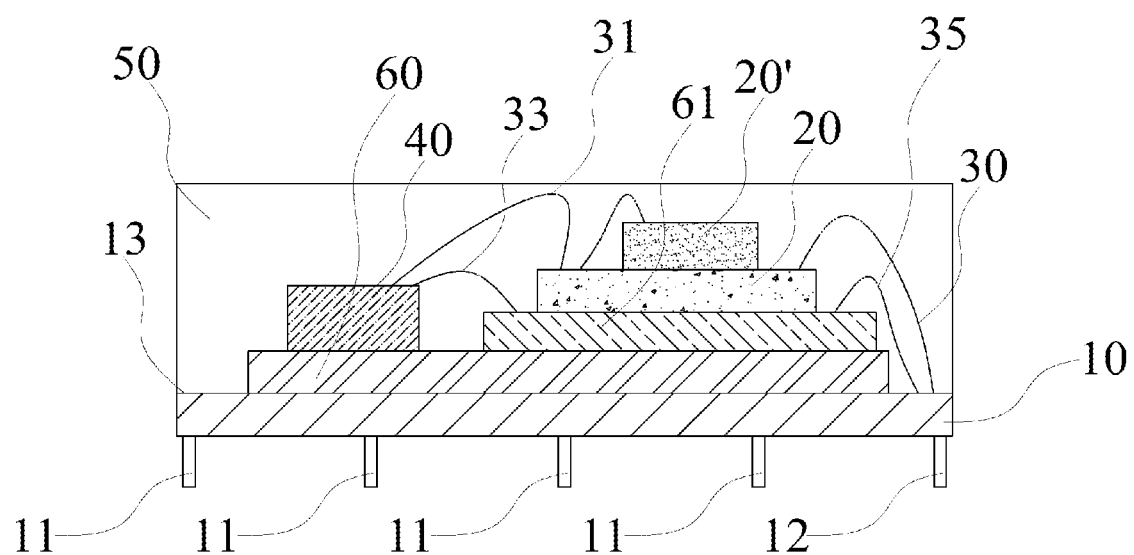
FIG. 2b is a schematic view of a system in package in the fifth embodiment.
Figure 4B:
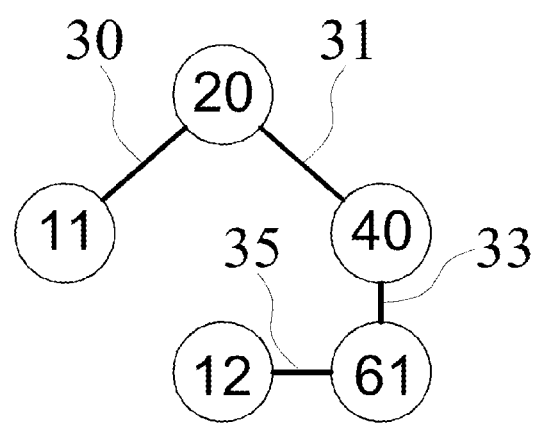
FIG. 4b is a schematic view for electric connection of a system in package in the fifth embodiment.

Referring to FIGS. 2b and 4b, which illustrate a system in package in the fifth embodiment. In the fifth embodiment different from the second embodiment, an aluminum layer (61) is added. Referring to FIG. 2b, which illustrates an aluminum layer (61) is coated between the silicon layer (60) and the die (20) and electrically connected to the ground pin (12) of the copper holder (10) through a sixth metal wire (35).

Referring to FIG. 4b, which illustrates the die (20) is electrically connected to the data pins (11), the ground pin (12), the passive element (40) and the aluminum layer (61), respectively, wherein: the die (20) is electrically connected to the data pins (11) through the first metal wire (30) such that electric conduction between outside signals/power and the die (20) is created and signals are transmitted to the outside; the die (20) is electrically connected to the passive element (40), which can be a quartz crystal unit (or Xtal), a resistor, a capacitor or an inductor to support operation of the die (20), through the second metal wire (31); the passive element (40) is electrically connected to the aluminum layer (61) for a concentrated grounding connection through the fourth metal wire (33); the aluminum layer (61) is electrically connected to the ground pin (12), which is taken as a zero potential reference and also a reference potential of a whole circuit, that is, 0V at the ground pin (12) for the uniform electrical potential in a whole circuit, through the sixth metal wire (35); the die (20) is further paired with a memory component in practice.

Accordingly, a system in package which is different from other semiconductor packaging structures and referred to as creative work in applications of semiconductor encapsulation meets patentability and is applied for the patent.

It should be reiterated that the above descriptions present the preferred embodiments of a system in package and any equivalent changes or modifications in specifications, claims or drawings still belongs to the technical field within the present disclosure with reference to claims hereinafter.

What is claimed is:

1. A system in package featuring no printed circuit board inside an encapsulation structure and comprises: a copper holder with a plurality of data pins and at least a ground pin; a silicon layer on a top face of the copper holder; a plurality of dies mounted on the silicon layer and electrically connected to the data pins of the copper holder; at least a passive element mounted on the silicon layer and electrically connected to the dies wherein the dies are electrically connected to the ground pin of the copper holder; a molding compound encasing the dies and the passive element on the top face of the copper holder.

2. The system in package as claimed in claim 1 wherein the dies are electrically connected to the data pins of the copper holder through a plurality of first metal wires.

3. The system in package as claimed in claim 1 wherein the passive element is electrically connected to the dies through a plurality of second metal wires.

4. The system in package as claimed in claim 1 wherein the dies are electrically connected to the ground pin of the copper holder through a plurality of third metal wires.

5. The system in package as claimed in claim 1 wherein the passive element is electrically connected to the ground pin of the copper holder through at least a fourth metal wire.

6. The system in package as claimed in claim 1 wherein the passive element is electrically connected to the data pins of the copper holder through at least a fifth metal wire.

7. The system in package as claimed in claim 1 wherein the silicon layer and the die accommodate an aluminum layer in between.

8. The system in package as claimed in claim 7 wherein the aluminum layer is electrically connected to the ground pin of the copper holder through at least a sixth metal wire.

* * * * *